United States Patent [19]
Ishikawa et al.

[11] Patent Number: 5,953,358
[45] Date of Patent: Sep. 14, 1999

[54] SEMICONDUCTOR LASER DEVICE

[75] Inventors: Takuya Ishikawa, Kanagawa; Akihiko Kasukawa, Tokyo, both of Japan

[73] Assignee: The Furukawa Electric Co. Ltd., Tokyo, Japan

[21] Appl. No.: 08/980,750

[22] Filed: Dec. 1, 1997

[30] Foreign Application Priority Data

Nov. 29, 1996 [JP] Japan ..................... 8-319309

[51] Int. Cl.$^6$ .............................. H01S 3/19; H01S 3/096
[52] U.S. Cl. .................. 372/46; 372/45; 372/49
[58] Field of Search ................... 372/46, 49, 92, 372/45

[56] References Cited

U.S. PATENT DOCUMENTS

| | | | |
|---|---|---|---|
| 4,722,088 | 1/1988 | Wolf | 372/44 |
| 4,815,084 | 3/1989 | Scifres et al. | 372/46 |
| 5,665,985 | 9/1997 | Iawta | 372/46 |

FOREIGN PATENT DOCUMENTS

| | | |
|---|---|---|
| 58-141587 | 8/1983 | Japan . |
| 5-175611 | 7/1993 | Japan . |
| 8-181376 | 7/1996 | Japan . |

OTHER PUBLICATIONS

Hamada H et al: "Wide–Stripe AlGaiNP Laser Diodes with Current–Blocking Region Near Facets Grown on Misoriented Substrates" Electronics Letters, vol. 27 No. 19, Sep. 12, 1991, pp. 1713–1715.

Sagawa M et al: "High Power COD–Free Operation of 0.098 M InGaAs/GaAs/InGaP Lasers with Non–Injection Near the Facets" Electronics Letters, vol. 30, No. 17, Aug. 18, 1994, p. 1410/1411.

*Primary Examiner*—James W. Davie
*Attorney, Agent, or Firm*—Helfgott & Karas, PC.

[57] ABSTRACT

A semiconductor laser has a laser active layer for receiving current from a pair of electrode for lasing operation. The end region in the vicinity of both the facets of the active layer does not receive current from the electrode. The interfaces between the end portions and the central portion receiving current are slanted from the plane normal to the optical axis of the laser, for stable mode operation of the laser device.

3 Claims, 7 Drawing Sheets

SEMICONDUCTOR LASER DEVICE

BACKGROUND OF THE INVENTION (a) Field of the Invention

The present invention relates to a semiconductor laser device and, more particularly, to an improvement of a semiconductor laser device having a non-current area at an end portion of an active stripe region.

(b) Description of the Related Art

An optical amplifier having an erbium (Er)-doped optical fiber is widely used in recent years. A high output power semiconductor laser which lases at a 1480 nm or 980 nm wavelength is generally used as a light source for excitation of the optical amplifier of this type. The demand for the high output power laser devices has risen more and more due to the wider range usage of the high output power laser.

It is generally known that the laser facet melts down when the semiconductor laser is driven at a high output power. This melt down phenomenon is called catastrophic optical damage (COD), and suddenly stops the operation of the laser device. The COD phenomenon is one of the factors to obstruct the higher output power of the semiconductor laser device used for excitation of the optical amplifier.

The mechanism for the generation of the COD is considered as follows. When a facet of the active layer in the semiconductor laser device rises in temperature, the bandgap of the active layer narrows in that portion, which in turn absorbs more light due to the narrowed bandgap to further rise in temperature. The temperature rise thus generated accelerates the deterioration of the facet of the active layer. In short, non-radiation recombination center formed in the facet is the core of the generation of the COD.

One of the measures for prevention of a COD failure is, as shown in FIG. 1, to provide a small area 51 in the vicinity of the output facet or both the facets of the semiconductor laser, in which current is not injected. The small area may be 25 $\mu$m in length as viewed in the direction of the optical axis of the stripe active layer 52. Thus, since there is no non-radiation recombination current component in the laser device which has the non-current area 51 in the facet, temperature rise is prevented at the facets, thereby maintaining a high resistance against the COD failure.

In general, when the current injected in the active layer is increased, the peak gain of the laser gradually shifts toward the lower wavelength, which causes a so-called "mode hopping" phenomenon, wherein the lasing mode discontinuously jumps to an adjacent Fabry-Perot mode. The wavelength interval by which the lasing mode hops generally coincides with the mode interval defined by the laser length.

However, in the semiconductor laser device which has the above-mentioned non-current area, it is often observed that the interval of the mode hopping reaches dozens of times the mode hopping defined by the laser length. In other word, the laser device which does not have the non-current area jumps toward a lower wavelength by a small amount with the increase in the injected current, whereas the semiconductor laser device which has a non-current area does not show change in the lasing wavelength for a longer period and then shows a sudden, large mode hopping, thereby causing an unstable lasing mode with respect to the specified injected current. The unstable lasing mode is an obstacle against the employment of the laser device as an excitation source of an optical amplifier.

SUMMARY OF THE INVENTION

It is an object of the present invention to provide a high output power semiconductor laser device which is suited to excitation of an optical amplifier having an Er-doped fiber and which has a non-current area and is capable of operating at a stable lasing mode with respect to specified injected current, thereby achieving a high resistance against a COD failure.

The semiconductor laser according to a first aspect of the present invention comprises a semiconductor substrate, a stripe of a semiconductor active layer overlying the semiconductor substrate, a pair of cladding layer sandwiching the active layer, and a pair of electrodes for supplying current into the active layer through the cladding layer, the active layer including a current injection area into which current is injected through an adjacent portion of the cladding layer and at least one non-current area into which current is not injected through an adjacent portion of the cladding layer, the current injection area and the non-current area being disposed consecutively in a direction of the stripe and defining an interface slanted from a plane normal to the stripe.

The semiconductor laser device according to a second aspect of the present invention comprises a semiconductor substrate, a stripe of a semiconductor active layer overlying the semiconductor substrate, a pair of cladding layer sandwiching the active layer, and a pair of electrodes for supplying current into the active layer through the cladding layer, the active layer having at least one facet slanted from a plane normal to the stripe.

In a preferred embodiment of the present invention, the non-current area is disposed in the vicinity of one of the facets or each facet of the semiconductor laser device, i.e., one or both the end portions of the semiconductor laser as viewed in the direction of the optical axis of the semiconductor laser.

It is possible to provide the boundary between the current injection area and the non-current area by the structure of the electrode for injecting current into the active layer in the vicinity of the end of the electrode as viewed in the direction of the optical axis of the stripe active layer. Or else, it is possible to provide the boundary by the facet shape of the dielectric (insulating) layer disposed between the active layer and the electrode for injecting current into the active layer. Or alternatively, it is possible to provide the boundary by defining the facet shape of the stripe active layer.

In the present invention, there is no limitation in the materials for the semiconductor laser device, and examples of such materials include GaAs, InP, GaP, GaN or compound semiconductors based on these materials.

The present inventors considered that the problem mode hopping can be solved by removing the light component reflected by the boundary between the current injection area and the non-current area from the lasing of the laser device and that the removal of such a light component can be obtained by slanting the boundary in the active layer from the plane normal to the optical axis of the laser device.

When current is injected for lasing into the laser active layer, the refractive index of the active layer is reduced due to the plasma effect. Accordingly, there is a small difference in refractive index between the current injection area, into which current is injected, and the non-current area, into which current is not injected. The conventional laser device having a non-current area has an equivalent reflective plane at the boundary between the current injection area and the non-current area.

It is assumed that a conventional laser device has a total length of 800 $\mu$m and comprises a pair of non-current areas, each of which has a length of 25 $\mu$m in the direction of the optical axis of the laser device, at both the facets of the active layer, as shown in FIG. 1. In this case, the semiconductor laser device equivalently has three additional lasers each having a length of 750 μm or 775 μm, in addition to the original laser of 800 μm in length. The present inventor considered that the Fabry-Perot modes defined by the lengths of the three additional lasers thus mixed to the original laser generate a groan, which corresponds to the ripples on the Fabry-Perot mode curve.

DESCRIPTION OF THE PREFERRED EMBODIMENTS

Figure 1:
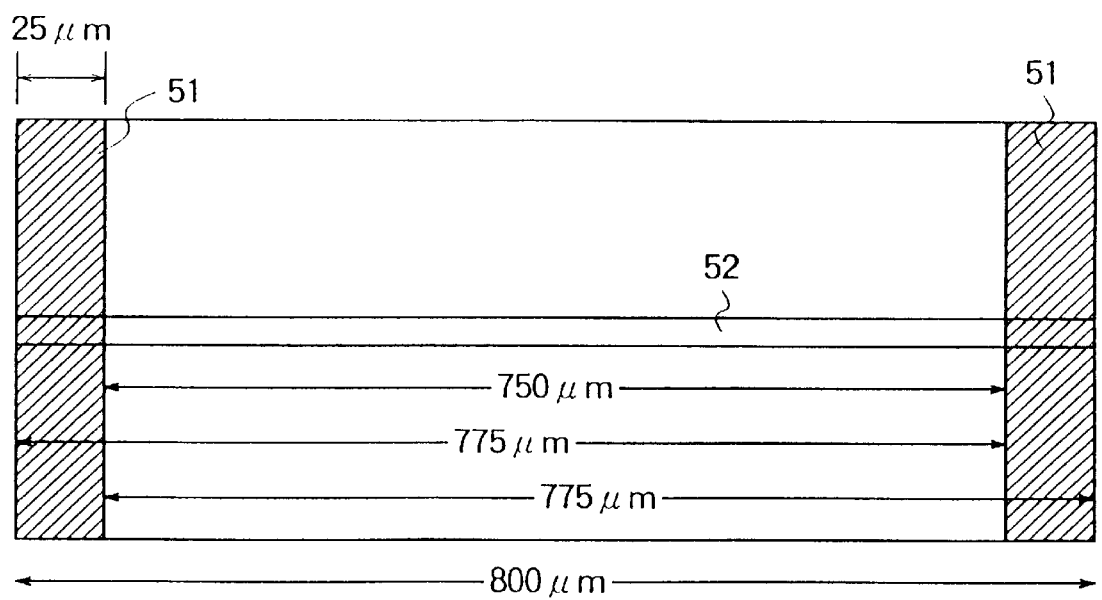
FIG. 1 is a schematic top plan view of a conventional semiconductor laser device.
Figure 2:
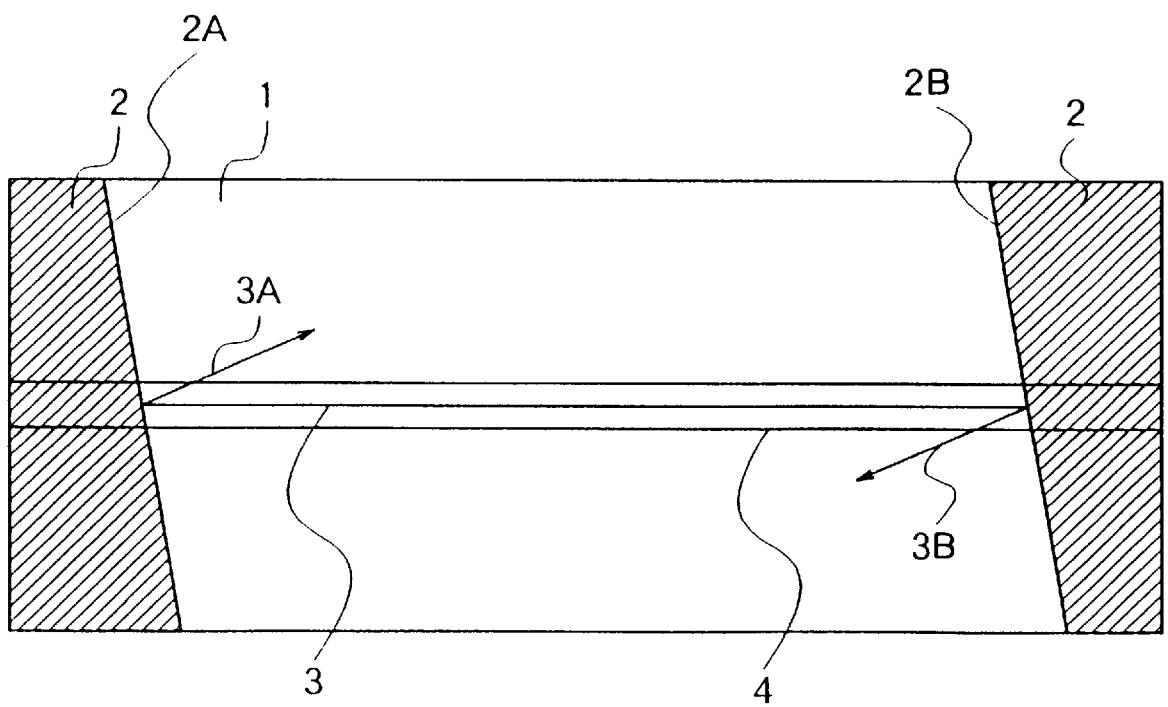
FIG. 2 is a schematic top plan view of a semiconductor laser device according to a principle of the present invention.

Referring to FIG. 2, there is shown a semiconductor laser device according to the principle of the present invention, wherein the laser device has a current injection area 1 into which current is injected from an electrode not shown and a pair of non-current areas 2 into which current is not injected from the electrode. The non-current areas 2 are disposed in the vicinity of both the facets of a stripe laser active layer 4 of the laser device. Each of the boundaries 2A and 2B between the current injection area 1 and the non-current areas 2 is slightly inclined or slanted from the plane normal to the optical axis 30 in the counter-clockwise direction. Among the light components 3A or 3B reflected at the boundary 2A or 2B, the light components which couple with the stripe active layer 4 are reduced by the slant of the boundary 2A or 2B.

Accordingly, a laser mode other than the Fabry-Perot mode originally designed by the total length of the laser device cannot be maintained for lasing. The laser device of the present embodiment does not have ripples in the Fabry-Perot mode and operates in a stable hopping mode similarly to a conventional semiconductor device having no non-current area, while having advantages of the conventional semiconductor laser having a non-current area.

Referring to FIGS. 3A to 3D each showing a spectrum diagram of a semiconductor laser device, the Fabry-Perot problem will be described in more detail for facilitation of understanding of the present invention. In these figures, gain of the laser device is plotted on ordinate against the wavelength of the laser plotted on abscissa.

Figure 3A:
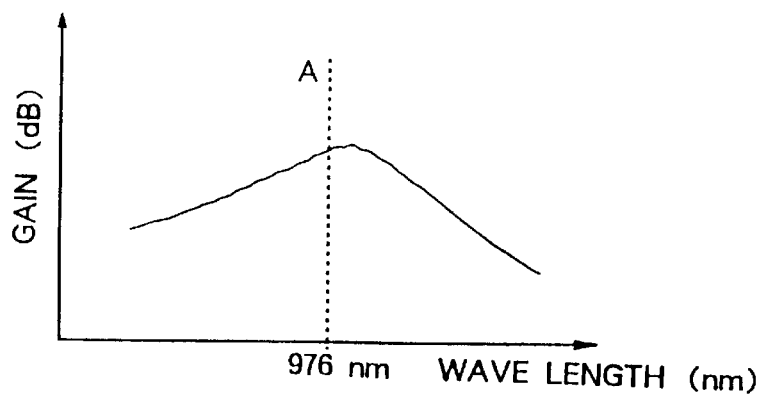
FIGS. 3A and 3B are graphs for showing the spectrum of the Fabry-Perot modes of a laser device having no non-current area.
Figure 3B:
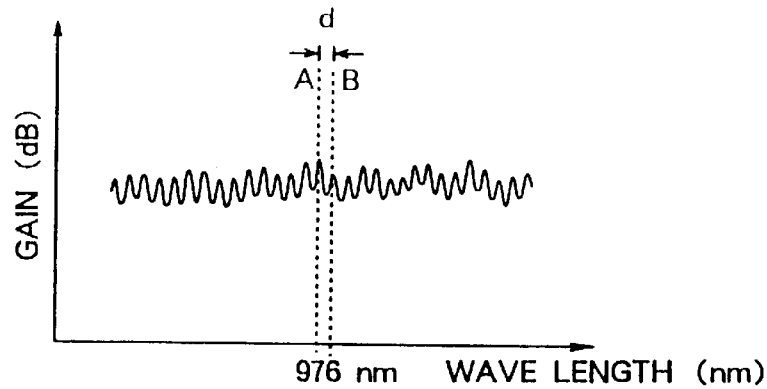

FIG. 3A shows a spectrum diagram for a conventional laser device of 750 μm in length having no non-current area into which current is not injected, wherein the spectrum is measured under a bias current of 0.9 times the threshold current of the laser device. As understood from the figure, the spectrum has a moderate mound in the vicinity of 976 nm (shown as "A axis") and falls toward both sides of the mound, reflecting the gain profile of the laser active layer. FIG. 3B is an partially enlarged profile of FIG. 3A in the vicinity 976 nm wavelength. The enlarged profile clearly shows a plurality of Fabry-Perot modes having a wavelength interval "d" of 0.18 nm between the adjacent modes, which is shown as the length A–B in FIG. 3B. The wavelength interval is determined by the laser active length of 750 μm.

Figure 3C:
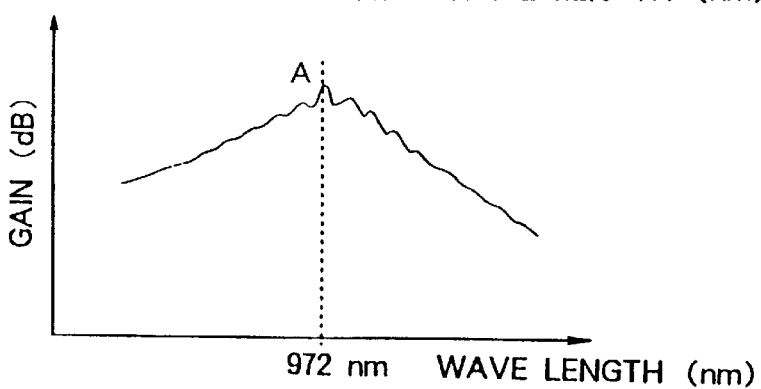
FIGS. 3C and 3D are graphs showing, similarly to FIGS. 3A and 3B, the spectrum of another laser device having a non-current area.

Referring to FIG. 3C, another spectrum diagram is shown for a conventional laser device having a total length of 800 μm and comprising a pair of non-current areas, into which current is not injected, in the vicinity of the facets of the laser device. Each of the non-current areas has a 25 μm length in the direction of the optical axis of the laser device, wherein the spectrum is measured under a bias current of 0.9 times the threshold current. Although the spectrum has a mound at a wavelength of 972 nm roughly reflecting the gain profile of the active layer, a plurality of ripples are superimposed on the Fabry-Perot modes, such as observed in FIG. 3A.

Figure 3D:
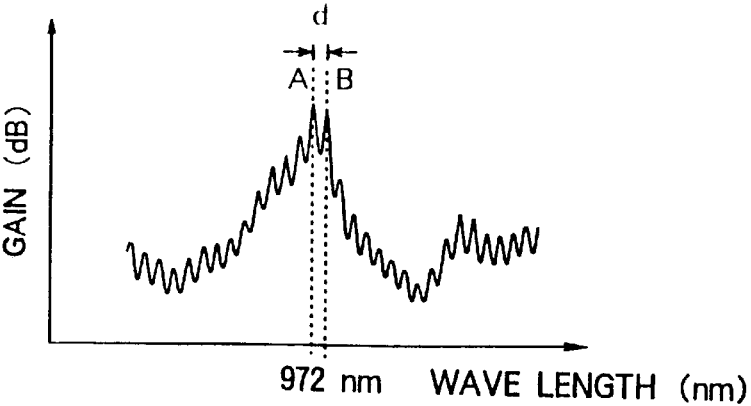

Referring to FIG. 3D showing an enlarged profile of FIG. 3C, similarly to FIG. 3B, in the vicinity of 972 nm wavelength, a plurality of ripples are observed, which have a longer wavelength interval than the interval 0.17 nm of the Fabry-Perot modes defined by the laser active length of 800 μm, in addition to the Fabry-Perot modes similar to those in FIG. 3C.

In a semiconductor laser device which does not have a non-current area into which current is not injected, when the injected current is increased in the current injection area after the start of the lasing operation, the gain profile shifts toward the smaller wavelength, and lasing selectively at one of the Fabry-Perot modes which is nearest to the peak gain wavelength in the direction of lower wavelength. The wavelength interval of the hopping modes is 0.18 nm which is determined by the laser active length of 750 μm.

On the other hand, a semiconductor laser device having a non-current area into which current is not injected, when the injected current is increased after the start of the lasing operation, although the gain profile shifts toward the lower wavelength, lasing wavelength does not change until the peak gain wavelength approaches to the mode peak adjacent to the moderate ripple, and does change at that peak suddenly.

It was observed that the change of the wavelength when the mode hopped to the peak wavelength adjacent to the moderate ripple was about 3 nm, which coincided with the wavelength interval of the moderate ripples. Thus, it can be said that the mode hopping of the semiconductor laser device was closely related to the spectrum below the threshold.

Figure 4:
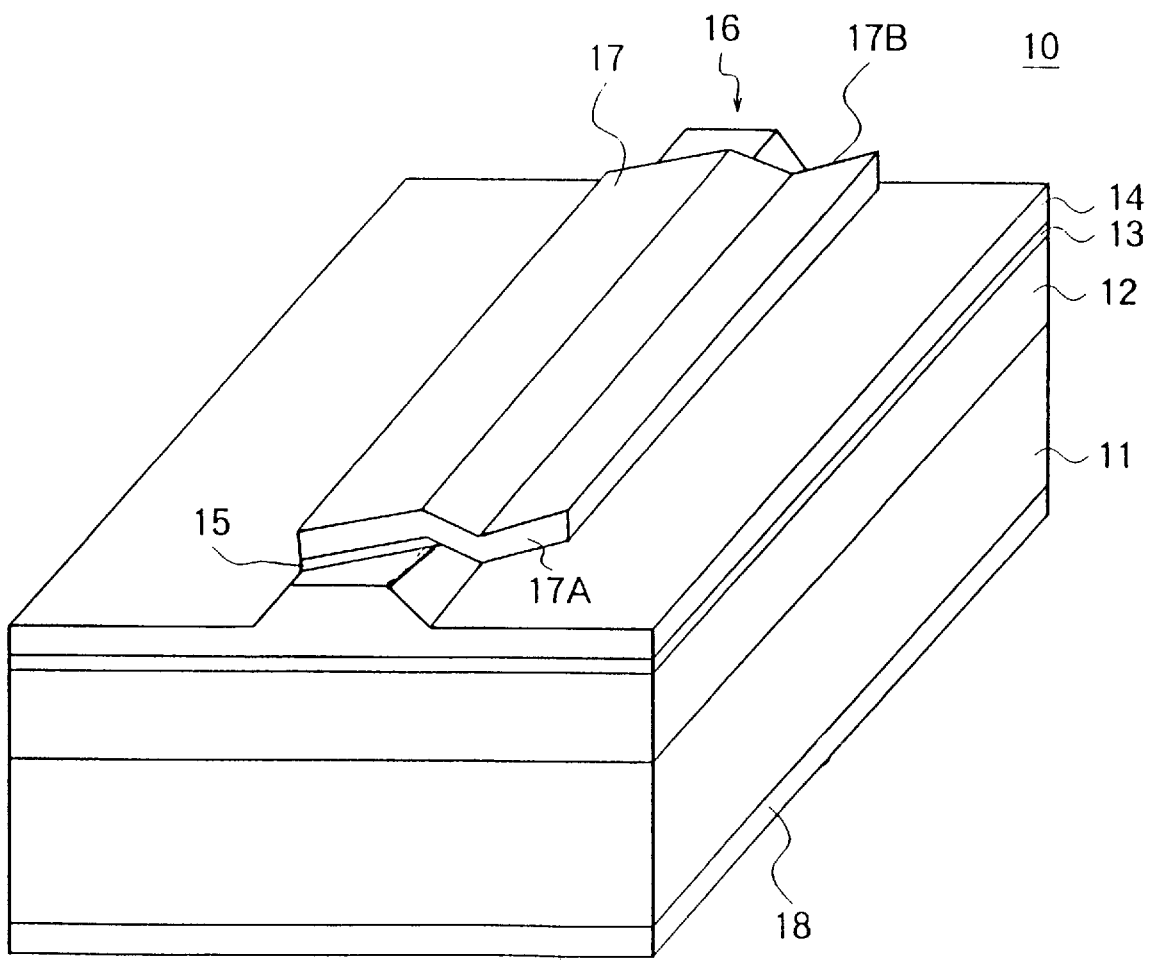
FIG. 4 is a perspective view of a semiconductor laser device according to a first embodiment of the present invention.

Referring to FIG. 4, a semiconductor laser device according to a first embodiment of the present invention comprises a pair of non-current areas at both the facets of the laser device, into which current is not injected, and which has a slanting interface with respect to the facets of the laser device. The average length of the non-current area is roughly 25 μm as viewed in the direction of the optical axis of the laser device.

The laser device of FIG. 4 can be fabricated as follows. First, an n-AlGaAs lower cladding layer 12, a first AlGaAs separate-confinement-heterostructure (SCH) layer not shown, an InGaAs quantum well active layer 13, a second AlGaAs SCH layer not shown, a p-AlGaAs upper cladding layer 14, and a p-GaAs contact layer 15 are consecutively formed on an n-GaAs substrate 11.

By selectively etching the layers from a top portion of the p-GaAs contact layer 15 to the upper cladding layer 14, a ridge stripe 16 extending in the direction of the optical axis of the laser device is formed. Subsequently, top and bottom electrodes 17 and 18 were selectively deposited on the top surface and bottom surface, respectively, of the resultant wafer, followed by selectively etching the contact layer 15 of the ridge structure 16, whereby the contact layer 15 exposed from the top electrode 17 is entirely removed, to obtain the laser device 10 of FIG. 4.

In the laser device, both the end surfaces 17A and 17B of the top electrode 17, as viewed in the direction of the optical axis, are slanted from the plane normal to the stripe 16 by an angle of about 10° for defining the interfaces between the current injection area, in which current is injected, and the non-current area, into which current is not injected, by the end surface 17A and 17B. In the present embodiment, the end surfaces 17A and 17B extend parallel to each other. The laser device was actually fabricated as samples which had a length of 800 μm.

Figure 5:
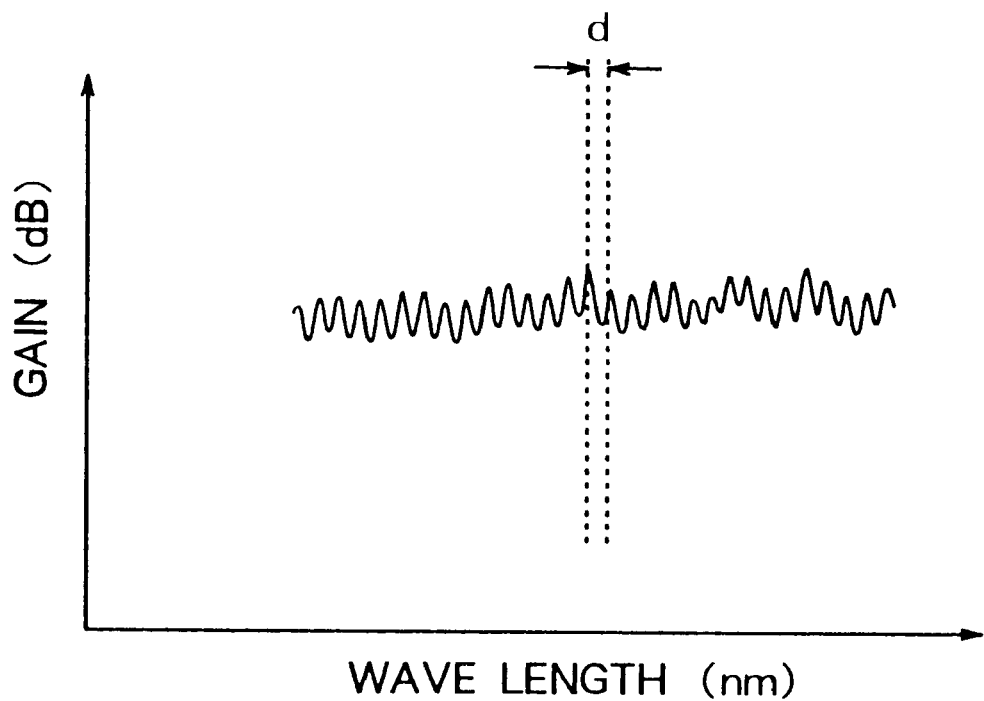
FIG. 5 is a graph showing a spectrum of the semiconductor laser device of FIG. 4.

Referring to FIG. 5, the detail of the spectrum of the samples of the semiconductor laser device of FIG. 4 is shown under a bias current of 0.9 times the threshold, similarly to FIGS. 3B and 3D. In FIG. 5, it will be understood that the curve of the Fabry-Perot modes is improved to be flat as compared to FIG. 4D and the moderate ripples are removed in the curve, which is due to the structure of the present embodiment wherein the boundary of the current injection area and the non-current area is slanted by about 10° from the plane normal to the stripe within the active layer.

The wavelength interval "d" of the mode hopping after the start of the lasing operation was 0.17 nm, which coincided with the interval determined by the length 800 μm of the laser device. The fabricated laser device exhibited a high resistance against the COD failure, and maintained the advantages of the laser device having a non-current area into which current is not injected.

Figure 6:
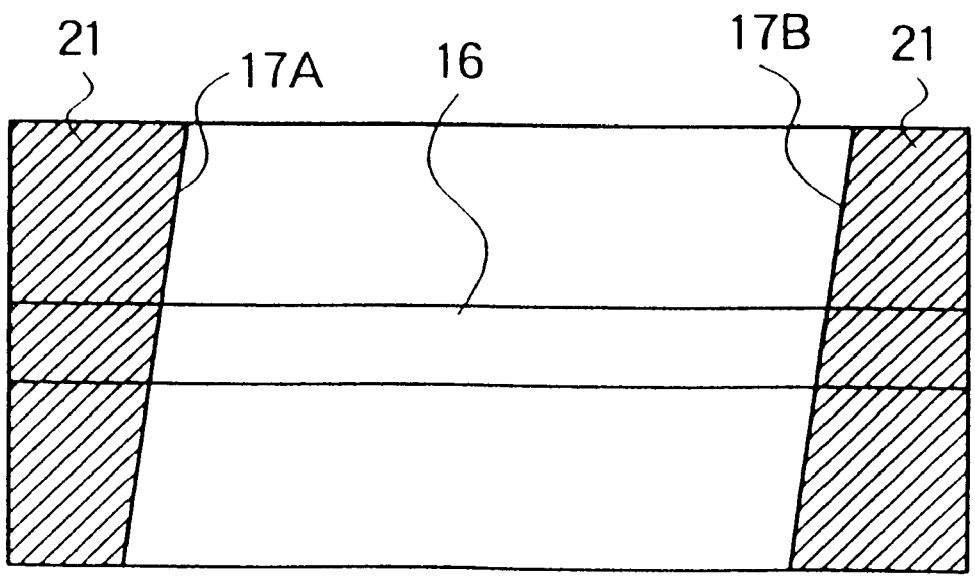
FIG. 6 is a schematic top plan view of a semiconductor laser device according to a modified first embodiment.

In the above embodiment, the non-current areas are formed by removing the top electrode in the vicinities of the facets of the laser device. The non-current areas can be formed in the present invention by other structures, such as shown in FIG. 6 which shows a modification of the first embodiment. The laser device of FIG. 6 is fabricated by forming a ridge stripe 16, and forming a pair of dielectric film patterns 21 on both the end portions of the ridge stripe 16, each of the film patterns 21 having a proximal end surface slanted from the plane normal to the ridge stripe 16. The slanted end surfaces of the dielectric film patterns 21 define the slanted interfaces 17A and 17B between the current injection area and the non-current areas. In this structure, the top electrode may be formed on the entire surface of the ridge stripe.

Figure 7:
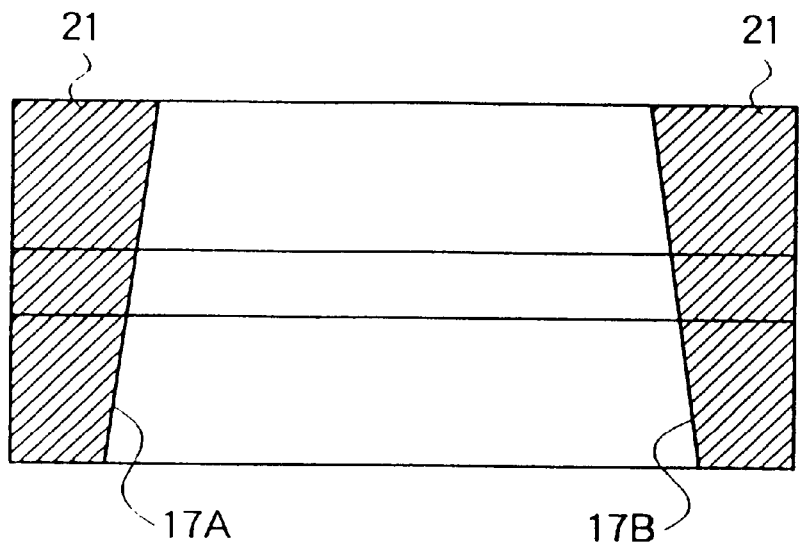
FIG. 7 is a top plan view of a semiconductor laser according to another modified first embodiment.

In the structures shown in FIGS. 4 and 6, both the interfaces between the current injection area and the non-current area extend parallel to each other. However, both the interfaces need not extend parallel to each other, and maybe disposed in symmetry with each other with respect to a transverse center line of the ridge stripe, as shown in the another modification of FIG. 7, or else, the interfaces may have different angle from the plane normal to the ridge stripe. Further, the non-current area may be disposed at one of the facets of the ridge stripe, and preferably at the output facet of the ridge stripe.

Figure 8:
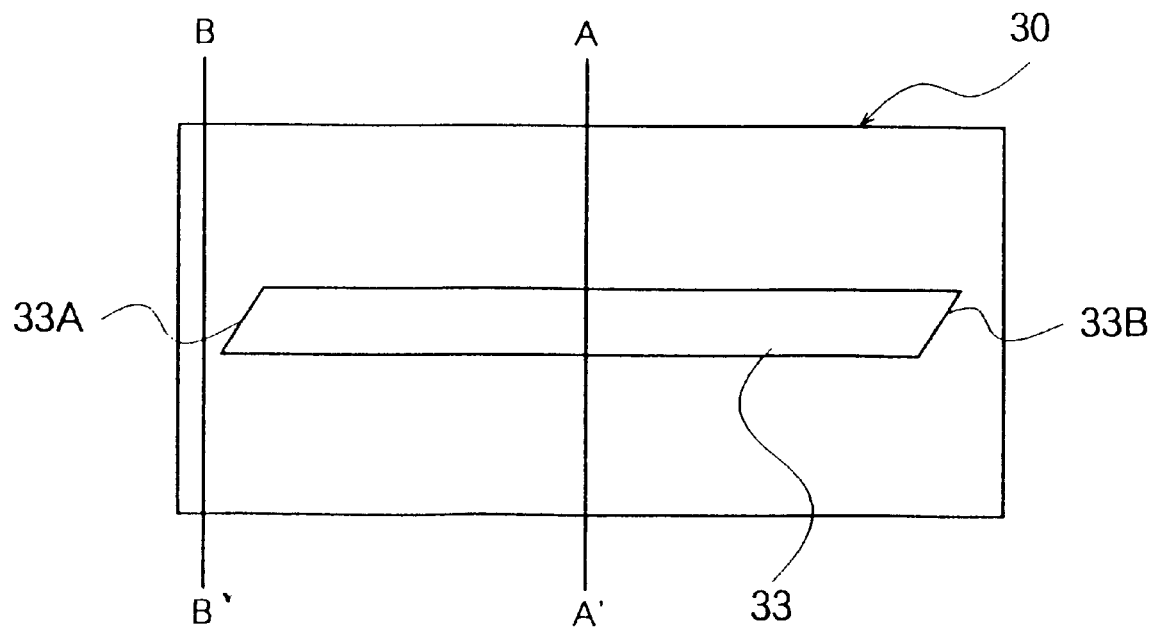
FIG. 8 is a schematic top plan view of a semiconductor laser device according to a second embodiment of the present invention.
Figure 9A:
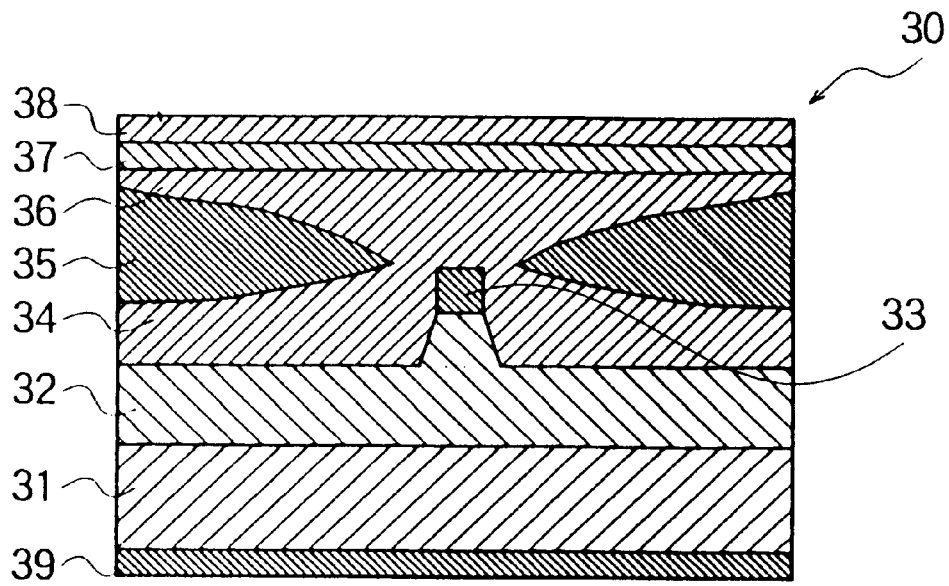
FIGS. 9A and 9B are sectional view taken along A–A' and B–B' in FIG. 8.
Figure 9B:
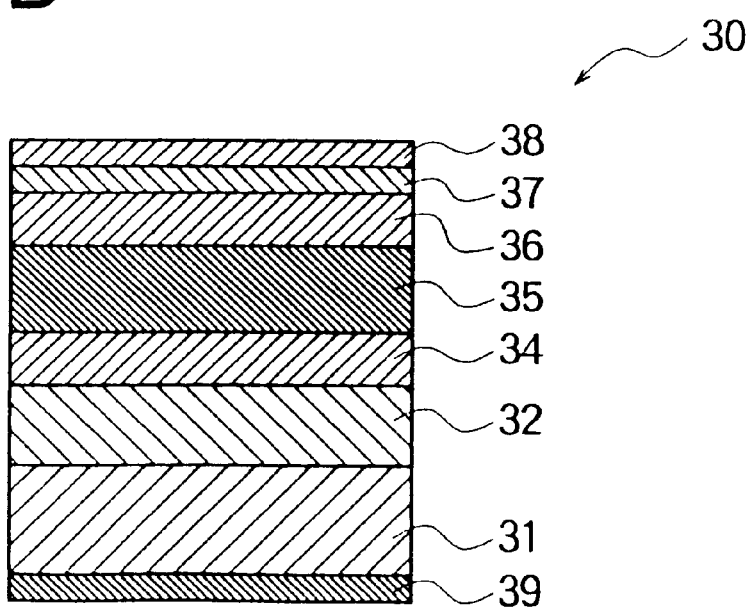

FIG. 8 shows a top plan view of a semiconductor laser device according to a second embodiment, and FIGS. 9A and 9B are sectional views taken along line A–A' and B–B', respectively, in FIG. 8. The laser device 30 of the present embodiment is of a buried structure having a pair of end areas in which a portion of the active layer is not formed, to obtain a window-type active layer.

The laser device of the present embodiment is fabricated as follows. First, an n-AlGaAs lower cladding layer 32, a first SCH layer not shown, an InGaAs quantum well active layer 33, a second SCH layer not shown, a p-AlGaAs cladding layer 34, and a p-GaAs cap layer are consecutively formed on an n-GaAs substrate 31. Subsequently, layers from a top portion of the lower cladding layer 32 to the cap layer are selectively etched using a SiN mask etc, as shown in FIG. 8, to leave a stripe of the quantum well active layer 33 having a pair of slanted facets 33A and 33B which are slanted from the plane normal to the optical axis by 15°. With the SiN mask remaining on the structure, an n-AlGaAs current confinement layer 35 and a p-AlGaAs cladding layer 36 are then consecutively grown on the sides of the active layer 33 for burying the active layer. Next, after removing the SiN mask, an additional p-AlGaAs cladding layer 36 and a GaAs contact layer 37 are consecutively grown, followed by forming a top electrode 38 and a bottom electrode 39 on both surfaes of the resultant wafer.

Samples of the semiconductor laser device of the present embodiment were fabricated and subjected to tests for the characteristics thereof. The samples showed the wavelength interval of the mode hopping defined by the length of the laser device, and accordingly, a stable lasing operation can be obtained, although conventional laser devices of the window type having interfaces normal to the optical axis showed larger wavelength interval of the mode hopping.

It will be understood that materials for the semiconductor laser device of the present invention are not limited to the specific examples as recited above, and may be materials such as InP, GaP, GaN, and compound semiconductors containing these materials. In laser devices having either of the materials as recited above has a high resistance against a COD failure and operates in a stable lasing mode.

Since the above embodiments are described only for examples, the present invention is not limited to the above embodiments and various modifications or alterations can be easily made therefrom by those skilled in the art without departing from the scope of the present invention.

What is claimed is:

1. A semiconductor laser device comprising a semiconductor substrate, a stripe of a semiconductor active layer overlying said semiconductor substrate, a first cladding layer and a second cladding layer sandwiching said active layer, and a pair of electrodes for supplying current into said active layer through said first cladding layer and said second cladding layer, said active layer including a current injection area into which current is injected through adjacent portion of said first cladding layer and said second cladding layer and at least one non-current area into which current is not injected through adjacent portion of said first cladding layer and said second cladding layer, said current injection area and said at least one non-current area being disposed consecutively in a direction of said stripe and defining an interface slanted from a plane normal to said stripe wherein said non-current area is disposed in a vicinity of at least one faces of said semiconductor active layer; wherein said interface is defined by an end of one of said pair of electrodes, as viewed in the direction of said stripe.

2. A semiconductor laser device comprising a semiconductor substrate, a stripe of a semiconductor active layer overlying said semiconductor substrate, a firs cladding layer and a second cladding layer sandwiching said active layer, and a pair of electrodes for supplying current into said active layer through said first cladding layer and said second cladding layer, said active layer including a current injection area into which current is injected through adjacent portion of said first cladding layer and said second cladding layer and at least one non-current area into which current is not injected through adjacent portion of said first cladding layer and said second cladding layer, said current injection area and said at least one non-current area being disposed consecutively in a direction of said stripe and defining an interface slanted from a plane normal to said stripe wherein said non-current area is disposed in a vicinity of at least one facet of said semiconductor active layer; further comprising a dielectric film interposed between one of said electrodes and said cladding layer, wherein said interface is defined by an end of said dielectric film.

3. A semiconductor laser device comprising a semiconductor substrate, a stripe of a semiconductor active layer overlying said semiconductor substrate, a first cladding layer and a second cladding layer sandwiching said active layer, and a pair of electrodes for supplying current into said active layer through said first cladding layer and said second cladding layer, said active layer including a current injection area into which current is injected through adjacent portion of said first cladding layer and said second cladding layer and at least one non-current area into which current is not injected through adjacent portion of said first cladding layer and said second cladding layer, said current injection area and said at least one non-current area being disposed consecutively in a direction of said stripe and defining an interface slanted from a plane normal to said strike wherein said non-current area is disposed in a vicinity of at least one facet of said semiconductor active layer.

* * * * *